United States Patent
Lin et al.

(10) Patent No.: US 10,714,329 B2
(45) Date of Patent: Jul. 14, 2020

(54) PRE-CLEAN FOR CONTACTS

(71) Applicant: Taiwan Semiconductor Manufacturing Co., Ltd., Hsinchu (TW)

(72) Inventors: Yu-Ting Lin, Tainan (TW); Chen-Yuan Kao, Hsinchu (TW); Rueijer Lin, Hsinchu (TW); Yu-Sheng Wang, Tainan (TW); I-Li Chen, Hsinchu (TW); Hong-Ming Wu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 9 days.

(21) Appl. No.: 16/146,529

(22) Filed: Sep. 28, 2018

(65) Prior Publication Data

US 2020/0105519 A1    Apr. 2, 2020

(51) Int. Cl.
| | |
|---|---|
| *H01L 21/4763* | (2006.01) |
| *H01L 21/02* | (2006.01) |
| *H01L 29/51* | (2006.01) |
| *H01L 21/768* | (2006.01) |
| *H01L 21/285* | (2006.01) |
| *H01L 29/417* | (2006.01) |

(52) U.S. Cl.
CPC .... *H01L 21/02063* (2013.01); *H01L 21/0231* (2013.01); *H01L 21/285* (2013.01); *H01L 21/76814* (2013.01); *H01L 21/76876* (2013.01); *H01L 29/41725* (2013.01); *H01L 29/517* (2013.01)

(58) Field of Classification Search
None
See application file for complete search history.

(56) References Cited

U.S. PATENT DOCUMENTS

| 6,346,489 B1 * | 2/2002 | Cohen | H01L 21/02063 257/E21.577 |
|---|---|---|---|
| 2006/0292863 A1 * | 12/2006 | Gambino | H01L 21/76814 438/638 |
| 2013/0330920 A1 * | 12/2013 | Liu | H01L 21/02063 438/608 |
| 2014/0342532 A1 * | 11/2014 | Zhu | H01L 21/3105 438/476 |

* cited by examiner

*Primary Examiner* — Angel Roman
(74) *Attorney, Agent, or Firm* — Sterne, Kessler, Goldstein & Fox P.L.L.C.

(57) ABSTRACT

The present disclosure describes a method that includes forming a dielectric layer over a contact region on a substrate; etching the dielectric layer to form a contact opening to expose the contact region; and pre-cleaning the exposed contact region to remove a residual material formed by the etching. During the pre-cleaning, the first contact region is exposed to an inductively coupled radio frequency (RF) plasma. Also, during the pre-cleaning, a direct current power supply unit (DC PSU) provides a bias voltage to the substrate and a magnetic field is applied to the inductively coupled RF plasma to collimate ions.

20 Claims, 11 Drawing Sheets

PRE-CLEAN FOR CONTACTS

BACKGROUND

Contact formation in semiconductor fabrication involves several operations, such as one or more photolithography operations, etching operations, wet cleans, pre-cleans, and metal depositions. The resistance of the formed contacts may depend on the efficiency of the pre-clean process used during the contact opening formation.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 10-30% of the value (e.g., ±10%, ±20%, or ±30% of the value).

The term "vertical," as used herein, means nominally perpendicular to the surface of a substrate.

Metallization in semiconductor fabrication involves several operations, including one or more photolithography operations, etch operations, wet cleans, pre-cleans, and metal depositions. The pre-clean process can be used to (i) remove oxides from a bottom surface of a contact opening, and (ii) prepare surfaces of the contact opening for a subsequent metal deposition. The pre-clean process can include a chemical etch (e.g., chemical reaction that dissolves the oxide), a physical etch (e.g., ion bombardment/sputtering of the oxide), or a combination thereof. A side effect of the pre-clean process can be "re-deposition" of oxide material from the sidewalls of the contact opening to the bottom surface of the contact opening and/or reshaping of the contact opening's profile. In terms of reshaping the contact opening's profile, the pre-clean process may cause several undesirable effects, including "necking" (e.g., a narrowing of the top opening of the contact opening known as "re-entrant profile"), "bowing" (e.g., a widening of the middle portion of the contact opening), a widening of a bottom portion of the contact opening, or a combination thereof. Each of the aforementioned contact profile changes can result in metal fill issues (e.g., seams or voids), contact resistance increase, and/or metal contact opens, shorts, and other undesirable interconnect characteristics.

Embodiments of the present disclosure are directed to a pre-clean process that can reduce contact profile modifications and oxide re-deposition from the sidewalls of the contact opening. In some embodiments, the pre-clean process includes a physical etch, such as an argon ion ($Ar^+$) sputter pre-clean process with enhanced ion directionality. In some embodiments, a substrate tuning bias supplied by a stack direct current power supply unit and combined with an inductively coupled plasma power source can be used to modulate the direction and energy of the argon ions. Further, magnets or electromagnets (e.g., coils) located on the sidewalls of the pre-clean reactor can further enhance the directionality of the argon ions. In some embodiments, an extended pedestal with a wide diameter (e.g., 300 mm to 330 mm) and adjustable height (e.g., 12 mm to 12.5 mm) can be used to improve the pre-clean uniformity across the substrate. In some embodiments, the tunable bias range can be from about −100 Volts to about 100 Volts.

Figure 1:
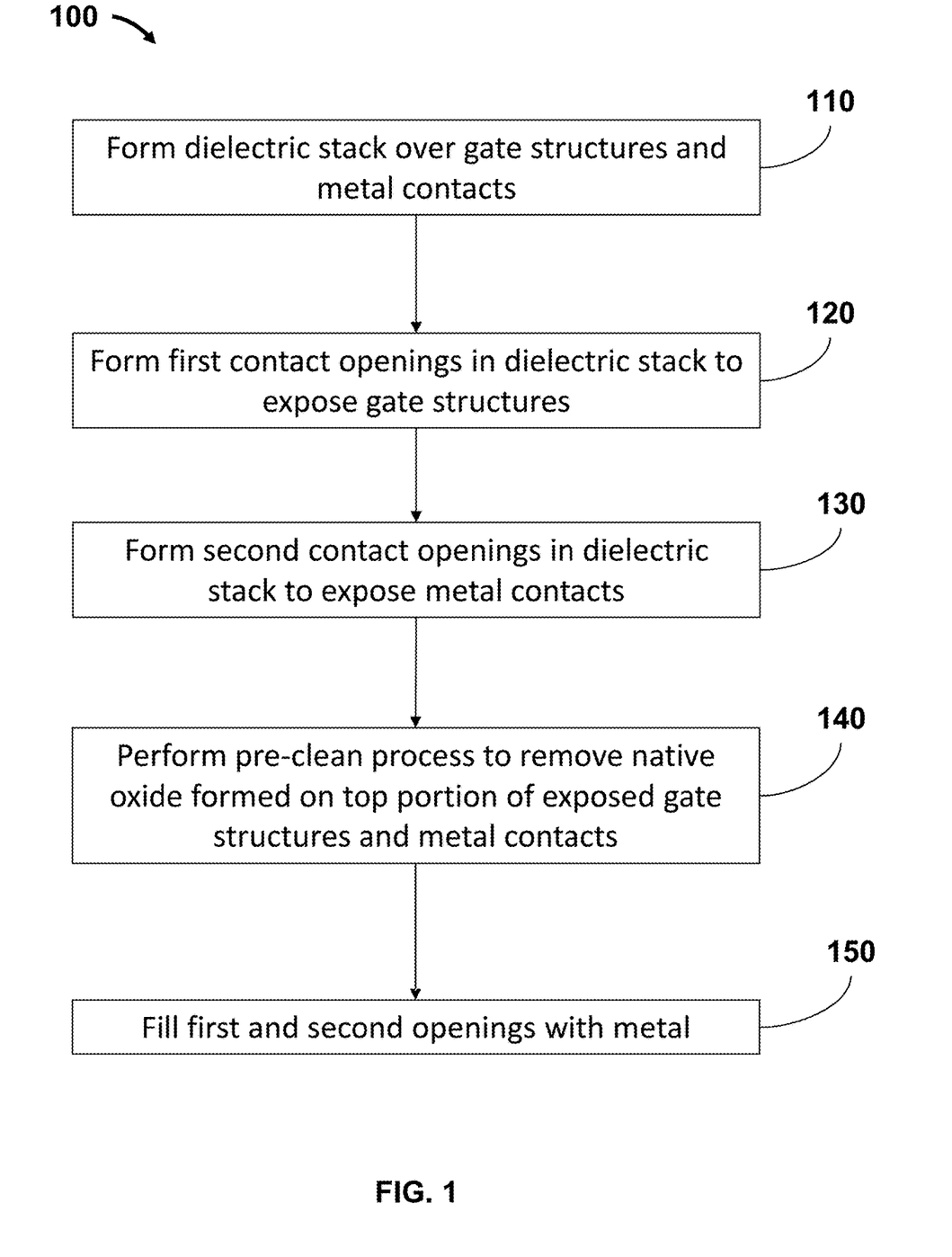
FIG. 1 is a flow diagram of an exemplary method which includes a novel pre-clean process, in accordance with some embodiments.

According to some embodiments, FIG. 1 is a flow chart of an exemplary method 100 which includes a novel pre-clean process that provides (i) improved oxide removal from the bottom surface of the contact opening, (ii) and reduced contact profile change. Other fabrication operations may be performed between the various operations of exemplary method 100 and may be omitted merely for clarity. Embodiments of the present disclosure are not limited to method 100.

Figure 2:
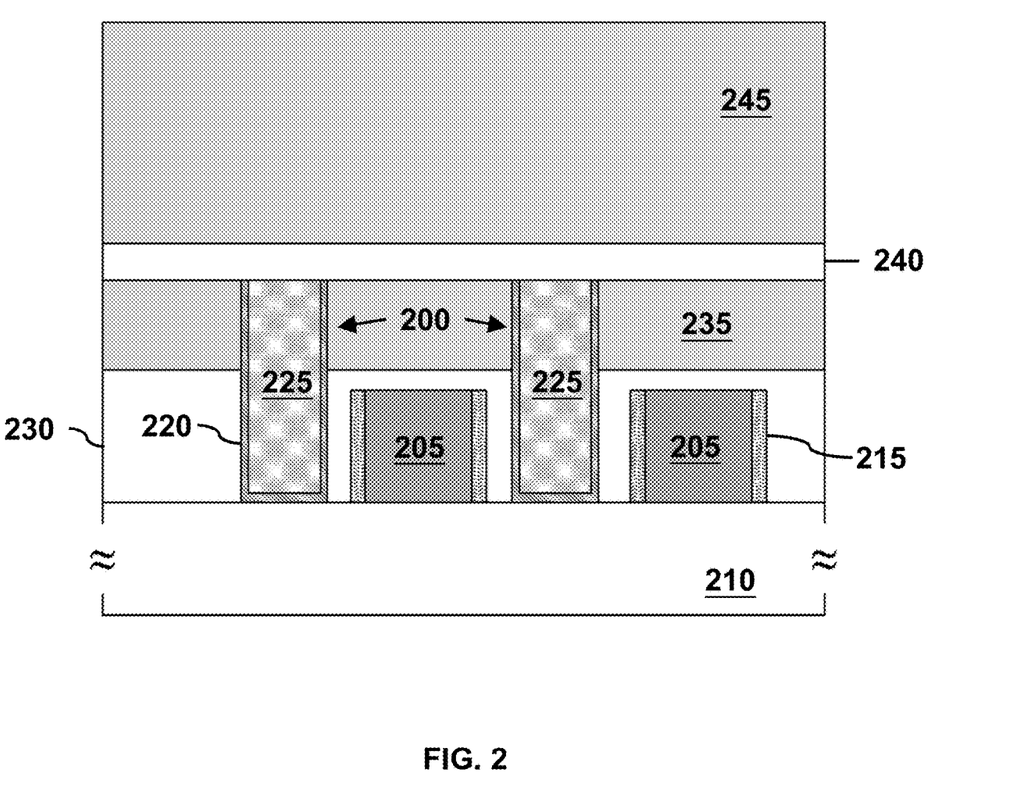
FIG. 2 is a cross-sectional view of a dielectric stack over gate structures and metal contacts, in accordance with some embodiments.

Method 100 begins with operation 110, where a dielectric stack is formed over gate structures and metal contacts. By way of example and not limitation, FIG. 2 is a cross-sectional view of a partially fabricated semiconductor structure described in operation 110, where a dielectric stack that includes interlayer dielectric (ILD) 245 and etch stop layer 240 is formed over gate structures 205 and metal contacts 200. According to some embodiments, gate structures 205 and metal contact 200 can be formed at an earlier stage of the fabrication process. For example, FIG. 2 can be a partially fabricated wafer in middle of the line (MOL), where metal contacts 200 and gate structures 205 have been previously formed over a substrate 210.

Substrate 210 can be a semiconductor wafer (e.g., a bulk silicon wafer or a silicon-on-insulator wafer). According to some embodiments, substrate 210 can include silicon or another elementary semiconductor such as, for example, germanium (Ge). Further substrate 210 can include layers or structures not shown in FIG. 2 merely for clarity. For example, substrate 210 can include any number or type of doped regions (e.g., n-type or p-type wells, channel regions, lightly doped regions, heavily doped regions such as source and drain regions, etc.), source and drain epitaxially grown layers, isolation regions like shallow trench isolation regions (STI), etc.

Gate structures 205 can include at least a gate electrode stack and a gate dielectric—both of which are not shown in FIG. 2 for clarity. In some embodiments, the high-k dielectric can be hafnium oxide ($HfO_2$), a hafnium silicate-based material, or another suitable dielectric material with dielectric constant (k-value) greater than 3.9—which is the dielectric constant of stoichiometric silicon oxide ($SiO_2$) and is used as an example reference. The gate electrode stack can include a capping layer over the gate dielectric, one or more metallic layers, a work function metal (WFM) stack, a metal fill layer, any other suitable material, or any combination thereof. The number and type of metallic layers in the gate electrode stack can depend on a transistor's threshold voltage requirements. By way of example and not limitation, exemplary metallic layers in the gate electrode stack can include a tantalum nitride (TaN) bottom layer and one or more titanium nitride (TiN) layers. In some embodiments, the WFM stack can include titanium/aluminum (Ti/Al) bi-layers or a titanium-aluminum (Ti—Al) alloy. The WFM stack can tune the work function of the gate electrode and influence the threshold voltage of the resulting transistor. However, the thickness and the number of the one or more TiN layers, in combination with the WFM stack, can set the transistor's threshold voltage. In some embodiments, the metal fill layer can include a TiN barrier layer and a tungsten (W) metal stack.

Abutting gate structures 205 are gate spacers 215. Gate spacers 215 can include a dielectric material, such as $SiO_2$, silicon oxynitride (SiON), carbon-doped silicon nitride (SiCN), silicon oxycarbide ($SiO_xC_y$), silicon nitride ($Si_xN_y$, or SiN), any other suitable material, or any combination thereof. Additionally, gate spacers 215 can be a stack of one or more layers that include the same or different materials. In some embodiments, gate spacers 215 can be used as alignment masks for the source/drain implants.

Metal contacts 200 can include a barrier layer 220 and a metal fill 225. In some embodiments, barrier layer 220 can include TiN and metal fill 225 can include cobalt (Co) or W. In some embodiments, metal contacts 200 are formed over a source/drain epitaxial layers or region—which is not shown in FIG. 2. Further, a silicide (not shown in FIG. 2) can be formed between the source/drain epitaxial region and metal contacts 200. Metal contacts 200 and gate structures 205 are formed in isolation layer 230. Isolation layer 230 can be a single dielectric layer or stack of dielectrics that electrically isolate the embedded structures, such as metal contacts 200 and gate structures 205. In some embodiments, isolation layer 230 can include $SiO_2$, carbon-doped silicon oxide ($SiO_xC$), silicon oxy-nitride (SiON), silicon-oxy-carbon nitride (SiOCN), silicon carbide (SiC), silicon carbon nitride (SiCN), SiN, any other suitable material, or any combination thereof. By way of example and not limitation, if isolation layer 230 includes a material other than SiN (e.g., silicon oxide), a SiN capping layer (not shown in FIG. 2) can be grown over gate structure 205 and gate spacers 215.

Interlayer dielectric (ILD) 235 can be formed over isolation layer 230. In the example of FIG. 2, ILD 235 surrounds metal contacts 200 over isolation layer 230. According to some embodiments, ILD 235 can be a single dielectric layer or a stack of dielectrics that include $SiO_2$, $SiO_xC$, SiON, SiOCN, SiC, SiCN, any other suitable material, or a combination thereof. ILD 235 can have a thickness range between about 10 nm and about 20 nm.

An etch stop layer 240 with a thickness between about 10 nm and about 20 nm can be formed over ILD 235 and ILD 245 can be formed over etch stop layer 240. By way of example and not limitation, etch stop layer 240 can be a SiN layer and ILD 254 can be a single dielectric layer or dielectric stack that includes $SiO_2$, $SiO_xC$, SiON, SiOCN, SiC, SiCN, any other suitable material, or a combination thereof. The thickness of ILD 245 can be between about 40 nm and 60 nm.

Figure 3:
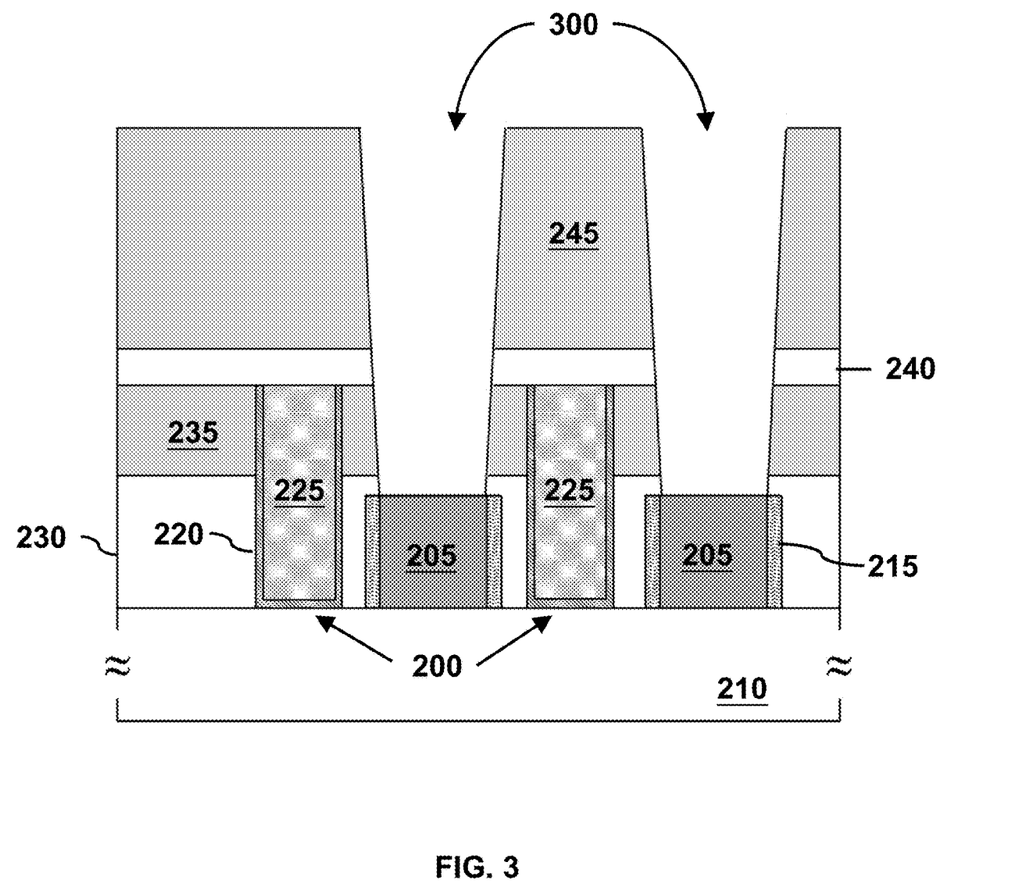
FIG. 3 is a cross-sectional view of contact openings in a dielectric stack over gate structures, in accordance with some embodiments.

Referring to FIGS. 1 and 3, method 100 continues with operation 120 and the formation of first contact openings 300 (thereafter contact openings 300) in the dielectric stack (e.g., ILD 235 and etch stop layer 240) and isolation layer 230 to expose the underlying gate structures 205. Contact openings 300 can be formed by patterning ILD 245, etch stop layer 240, ILD 235, and isolation layer 230 with photolithography and etch processes. By way of example and not limitation, the formation of contact openings 300 is described below. A coat of photoresist (not shown in FIG. 3) can be applied over ILD 245. The photoresist can be patterned (e.g., exposed and developed) according to a desired pattern; for example, a desired pattern can be the formation of openings in the photoresist that align with gate structures 205 and expose respective portions of ILD 245. Unexposed areas of the photoresist can be stripped with a wet or dry etch process to leave behind the desired pattern of developed photoresist on ILD 245. A dry etch process can be used, for example, to remove exposed areas of ILD 245 through the openings in the patterned photoresist. Areas of ILD 245 that are covered by the developed photoresist can be protected from the etch chemistry of the dry etch process and therefore not etched. The etch process can be anisotropic so that the sidewalls of contact opening 300 can be substantially vertical, for example, greater than 80°. By way of example and not limitation, a dry etch chemistry can include a mixture of carbon fluoride gases ($CF_x$). In some embodiments, the etch process can also etch part of gate spacers 215 when gate structure 205 is exposed. The dry etch process can include several steps, each of which may require different etching conditions (e.g., etch chemistry, process pressure, temperature, etc.). Once contact openings 300 are formed, the pattern photoresist is removed (e.g., stripped with a wet or dry etch process). In some embodiments, an ashing operation is subsequently performed to chemically remove any polymer (e.g. carbon based material) that has been formed as a result of the etch process. Further, a wet clean can be performed to remove particles and residual photoresist from the surface of ILD 245 and contact openings 300.

Figure 4:
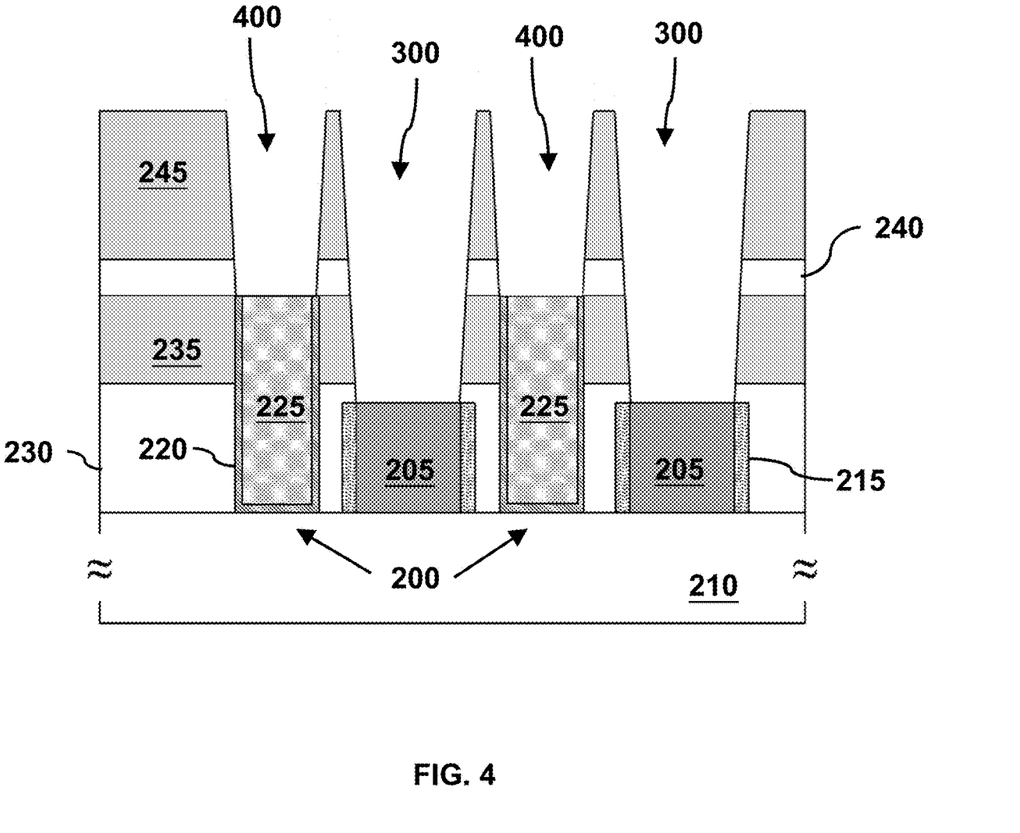
FIGS. 4 and 5 are cross-sectional views of contact openings in a dielectric stack over gate structures and metal contacts, in accordance with some embodiments.

Referring to FIGS. 1 and 4, method 100 continues with operation 130 and the formation of second contact openings 400 (thereafter contact opening 400) in the dielectric stack (e.g., ILD 235 and etch stop layer 240) to expose the underlying metal contacts 200. Forming contact openings 400 can be accomplished in a single operation process that is similar to the method described above to form first contact openings 300. For example, a coat of photoresist (not shown) can be applied on ILD 245. The photoresist can be subsequently exposed and developed according to a desired pattern; for example, a desired pattern can be the formation of openings in the photoresist that align with metal contacts 200 and expose respective portions of ILD 245. Unexposed areas of the photoresist can be stripped with a wet or dry etch process to leave the desired pattern of developed photoresist on ILD 245. A dry etch process can be used, for example, to remove exposed areas of ILD 245 through the openings in the patterned photoresist. Areas of ILD 245 that are covered by the developed photoresist can be protected from the etch chemistry of the dry etch process and therefore not etched. The etch process can be anisotropic so that the sidewalls of contact opening 400 can be substantially vertical, for example, greater than 80°. By way of example and not limitation, a dry etch chemistry can include a mixture of carbon fluoride gases ($CF_x$). The resulting second contact openings 400 are shown in FIG. 4.

Figure 5:
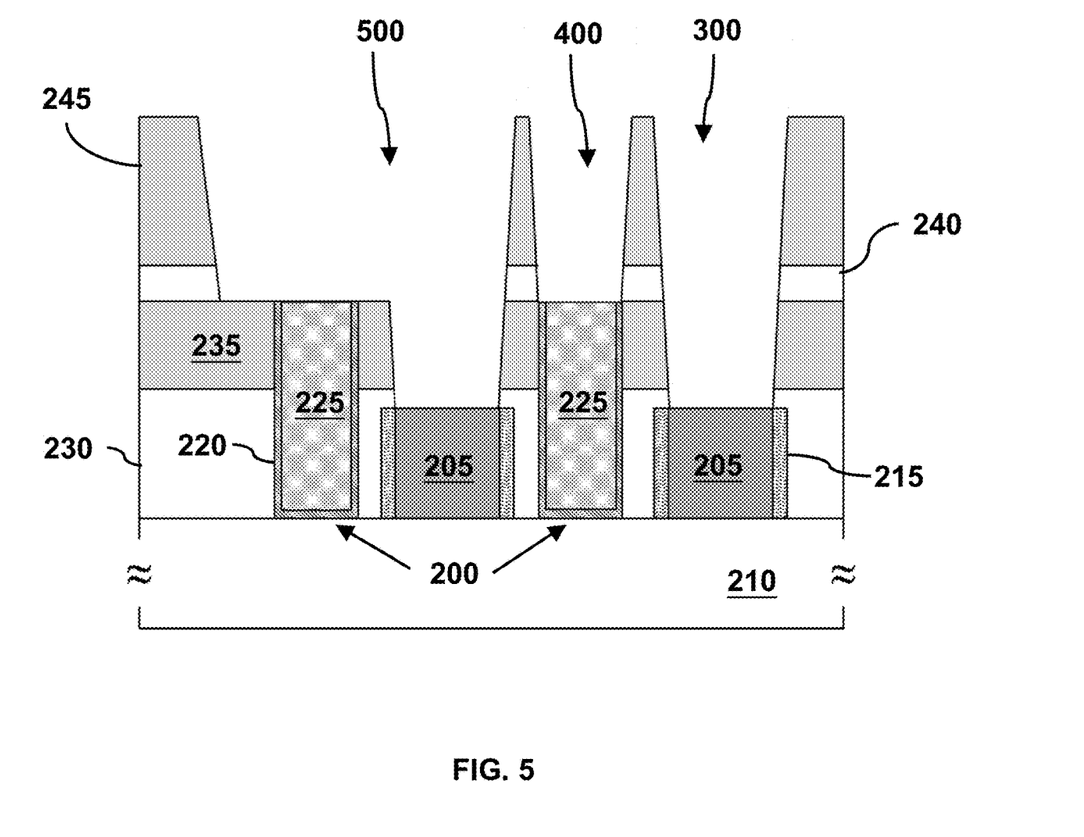

In some embodiments, a "shared" contact opening 500 can be formed as shown in FIG. 5. A shared contact opening 500 is a contact opening that exposes concurrently a metal contact 200 and a gate structure 205. By way of example and not limitation, a shared contact opening 500 can be formed with a dual photolithography step. The dual photolithography step can also include two etch operations. For example, during the first etch operation, a first photolithography and a first etch can form a first contact opening that exposes a portion of metal contact 200; and a second photolithography and second etch operation can form a second contact opening that is partially shifted compared to the first opening and can expose a portion of gate structure 205. The combination of the first and second contact openings form the "shared" contact opening 500 shown in FIG. 5.

Figure 6:
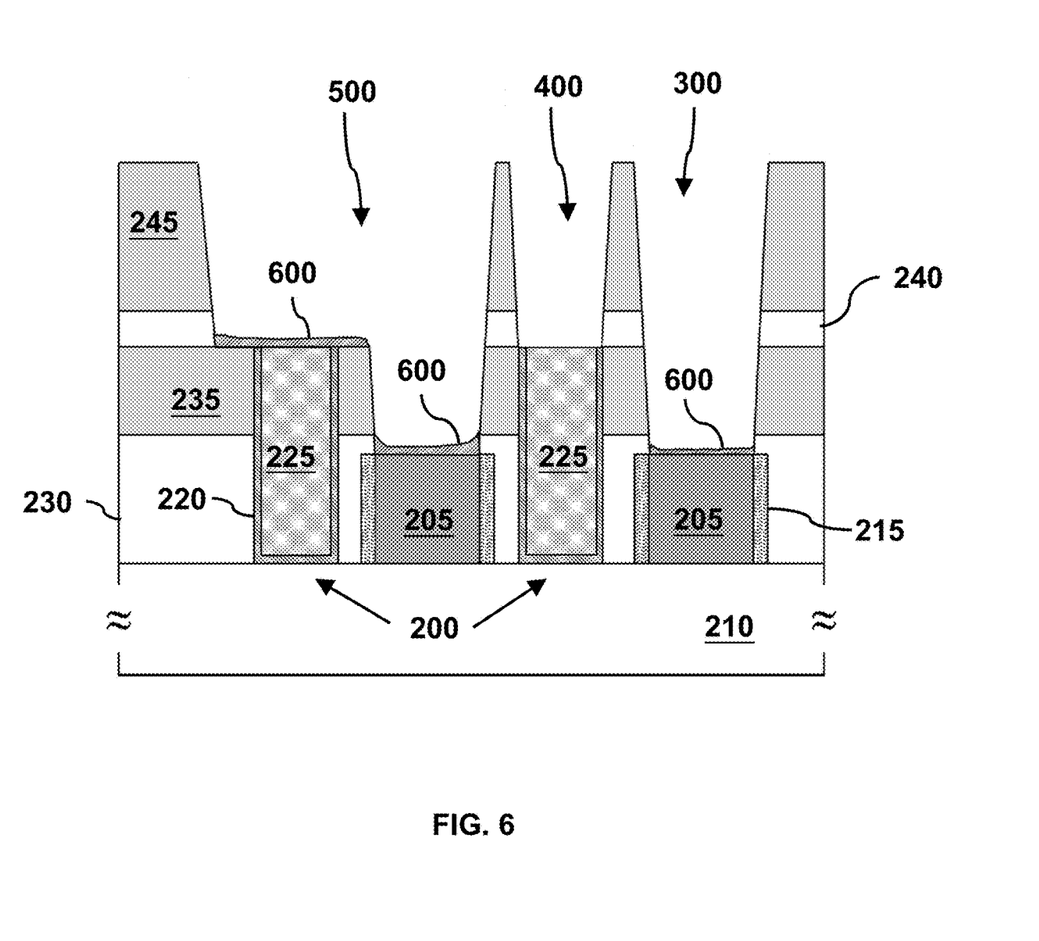
FIG. 6 is a cross-sectional view of contact openings with a residual or re-deposition layer, in accordance with some embodiments.

During the formation of contact openings 300, 400, and 500, material from ILD 230 and 245 can be re-deposited (e.g., re-sputtered) at the bottom surfaces of the contact openings to form a residual or re-deposition layer 600, as shown in FIG. 6. The formation of residual or re-deposition layer 600 is an undesirable side effect of the etch process which can increase contact resistance. Since the sidewalls of contact openings 300, 400, and 500 are formed primarily from ILD 245 and 235, re-deposition layer 600 can include $SiO_2$, $SiO_xC$, SiON, SiOCN, SiC, SiCN, or any combination thereof. In some embodiments, the thickness of re-deposition layer 600 can range from about 0.3 nm to about 1.3 nm. However, the aforementioned thickness of re-deposition layer 600 is not limiting.

In referring to FIGS. 5 and 6, the profile geometry of each contact opening can be different. For example, contact opening 500 features a wide top opening, a large depth that reaches to gate structure 205, and a multi-level bottom surface (e.g., a bottom surface on metal contact 200 and another bottom surface on metal gate structure 205). On the other hand, contact opening 400 has a narrow top opening and a shallower depth. Further, contact opening 300 has a narrow opening, a similar depth with contact opening 400, but a smaller bottom surface. In other words, the contact openings in FIGS. 5 and 6 have different aspect ratios. The aspect ratio of a contact opening can be defined as the ratio of its depth to its width (e.g., its top opening width). Consequently, the aspect ratio of contact opening 300 is larger than the aspect ratio of contact openings 400 and 500.

High aspect ratio contact openings can be more challenging to clean with a pre-clean process that uses physical sputtering to remove oxide. For example, it is harder for the sputtering ions to reach to the bottom of the contact opening and remove re-deposition layer 600. This is because, in a high aspect ratio contact of at least (for example) about 3:1, the argon ions have a higher probability of hitting the sidewalls of the opening prior to reaching the bottom surface of the contact opening. This can result in material re-sputtering from the sidewalls of the opening and contact profile changes including bowing, necking (re-entrant profile), or a combination thereof. To mitigate the contact profile changes and improve the cleaning efficiency of the pre-clean process, the argon ions have to impinge the substrate at about 90° incident angle with respect to the substrate's surface.

In addition, the argon ions accelerated towards substrate 210 need to have sufficient kinetic energy to successfully remove (e.g., clean) re-deposition layer 600. According to some embodiments, the pre-clean process removes other materials—e.g., Ti, W, Co, TiN, and titanium-aluminum (TiAl)—at a lower etch rate. As discussed above, such materials may be included in metal contacts 200 and metal gate structures 205. Consequently, the pre-clean process forms a recess on metal contacts 200 and gate structures 205.

In operation 140 of method 100, a pre-clean process is used to remove re-deposition layer 600. In some embodiments, the pre-clean process can remove from about 5 nm to about 45 nm of oxide (e.g., $SiO_2$). According to some embodiments, the pre-clean process uses a physical etch (e.g., ion bombardment) to remove re-deposition layer 600 from the bottom surfaces of contact openings 300, 400, and 500. By way of example and not limitation, the pre-clean process of operation 140 can be performed in a reactor 700 shown in FIG. 7. In the pre-clean process of operation 140, argon ions are generated from an argon plasma 705, which can be produced by an inductively coupled radio frequency (RF) plasma source (not shown in FIG. 7). In some embodiments, the inductively coupled plasma source produces a forward power between about 250 Watts and about 600 Watts. In this forward power range, the argon plasma reflected power can range from 0 to about 50 Watts. During the pre-clean process, the argon gas flow into reactor 700 can range from about 5 sccm to about 10 sccm and the reactor pressure can range from about 0.01 Torr to about 5 Torr. In some embodiments, a stacking direct current (DC) power supply unit (PSU) 710—which can be attached to a radio frequency (RF) generator 720—can be used to modulate a bias applied to substrate 210 (e.g., a substrate bias) through a conductive pedestal 715. In turn, the substrate bias can be used to modulate the energy at which the argon ions from the plasma impinge the surface of substrate 210—and therefore the sputtering amount during the pre-clean process. Consequently, the stacking DC PSU 710 can be used to tune the sputtering amount in the pre-clean process. In some embodiments, the DC PSU 710 can apply a substrate bias between about −100 Volts and about 100 Volts (e.g., about −100 Volts, about −50 Volts, about −20 Volts, about 0 Volts, about 20 Volts, about 50 Volts, about 100 Volts, etc.) to achieve an optimal sputtering amount. For example, a substrate bias below −100 Volts may increase the sputtering amount, but damage the substrate. On the other hand, a substrate bias above 100 Volts can result in an adequate sputtering amount. Electrical connections to conductive pedestal 715 are provided, for example, with a feed-through connection 725. Additionally, conductive pedestal 715 can be, for example, an electrostatic chuck that includes a conductive top portion (not shown) that includes Ti and an insulating bottom portion (not shown) that includes quartz. The conductive top portion of conductive pedestal 715 can be in contact with the backside of substrate 210. In some embodiments, conductive pedestal 715 has a diameter larger than substrate 210 (e.g., 300 mm). A larger diameter pedestal can provide improved pre-clean uniformity, according to some embodiments. For example, the diameter of conductive pedestal 715 can range from about 300 mm (e.g., about equal to the diameter of substrate 210) to about 330 mm. A conductive pedestal with a diameter larger than about 330 mm does not offer additional uniformity benefits, according to some embodiments. Further, extended conductive pedestal 715 has a height that can range from about 12.0 mm to about 12.5 nm. According to some embodiments, cleaning efficiency for the pre-clean process can be tuned through the combination of the bias applied to argon plasma 705 and the DC bias applied to substrate 210 through stack DC PSU 710. The aforementioned ranges should not be considered limiting and wider ranges can be used depending on the reactor's geometry.

Figure 7:
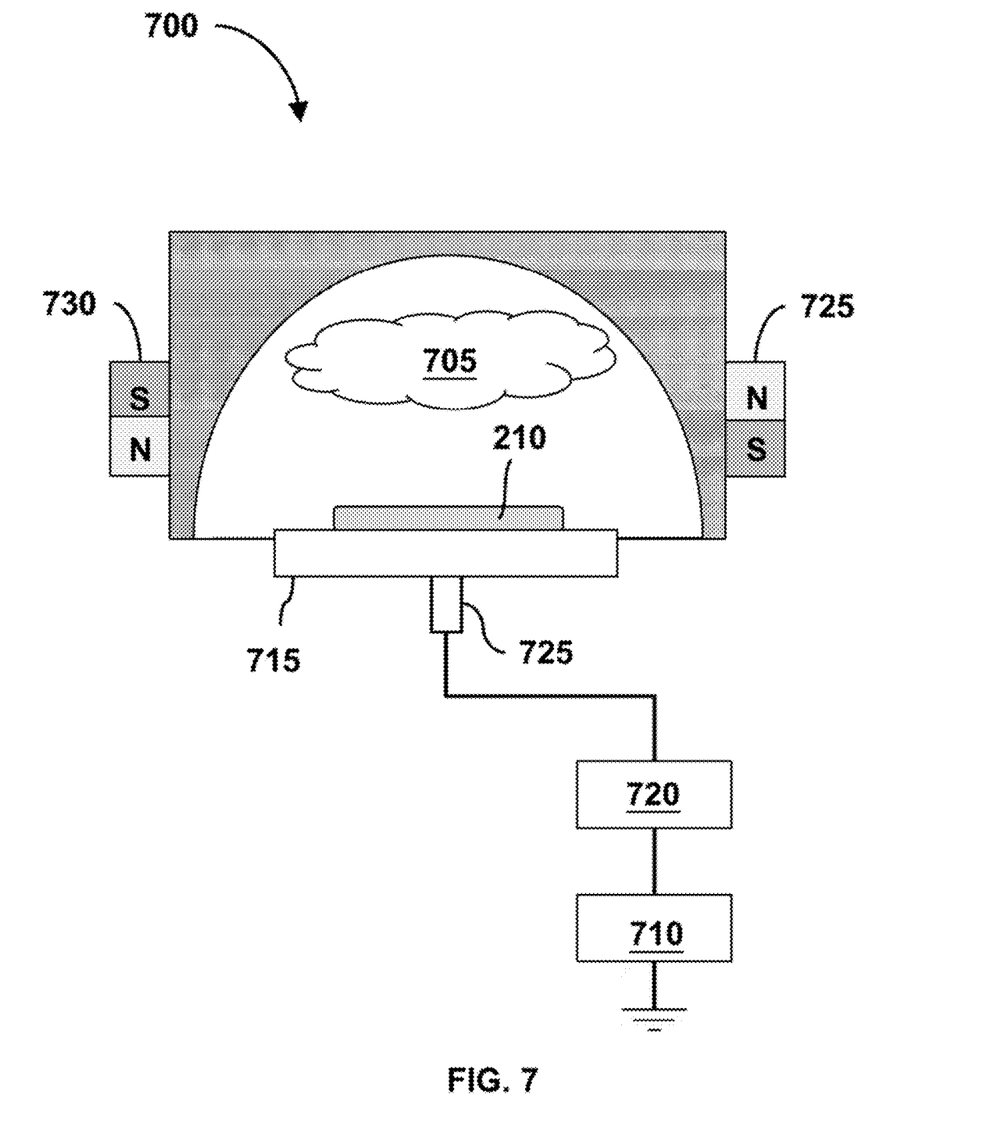
FIG. 7 is a cross-sectional view of a pre-clean reactor, in accordance with some embodiments.

The pre-clean uniformity and etch amounts can be further fine-tuned with the use of cylindrical magnets 725 and 730 attached to opposite sidewalls of reactor 700. In some embodiments, magnets 725 and 730 can be configured to have opposite polarities as shown in FIG. 7. The generated magnetic fields, which are perpendicular to conductive pedestal 715, can collimate the argon ions of argon plasma 705 across a larger surface area of substrate 210. In some embodiments, side electron magnets with four set of coils can be used instead of cylindrical magnets 725 and 730. By way of example and not limitation, the electromagnetic coils can be connected to an RF source that can provide, for example, about 1.5 kWatts of power. Modulation of the argon ion energy and directionality can be accomplished by synchronizing the RF signal from the coils, the bias applied to substrate 210, and the bias applied to argon plasma 705.

The placement of the aforementioned components of reactor 700 can be different depending on the design of reactor 700. Consequently, the depiction of reactor 700 in FIG. 7 should not be limiting. For illustration purposes, FIG. 7 includes select portions of reactor 700 and other portions (not shown) may be included. For example, gas lines, gas exhaust lines, electrical connections, heaters, valves, additional panels, match boxes, additional RF generators, additional DC power supplies, isolation transformers, pump stacks, external peripherals and equipment, and other elements may be included.

The pre-clean process conditions discussed above may have a distinct effect on the profile of contact openings with different aspect ratios, according to some embodiments. For example, in contact opening 400 of FIG. 8, when the bias applied to substrate 210 (e.g., by stack DC PSU 710) increases, top opening 805 can become wider. On the other hand, and for the same substrate bias condition, contact opening 300 may develop a re-entrant profile with overhang 810 that ranges, for example, from about 12 nm to about 16 nm. Re-entrant profiles in contact openings are undesirable because they can result in poor metal fill and high contact resistance. Consequently, for a higher substrate bias voltage (e.g., about 100 Volts), high aspect ratio contacts (e.g., higher than about 3:1) can develop a re-entrant profile, while contact openings with lower aspect ratio can become larger. Hence, tuning the bias voltage applied to the substrate can provide a balance between contact profiles in high and low aspect ratio contact openings.

Figure 8:
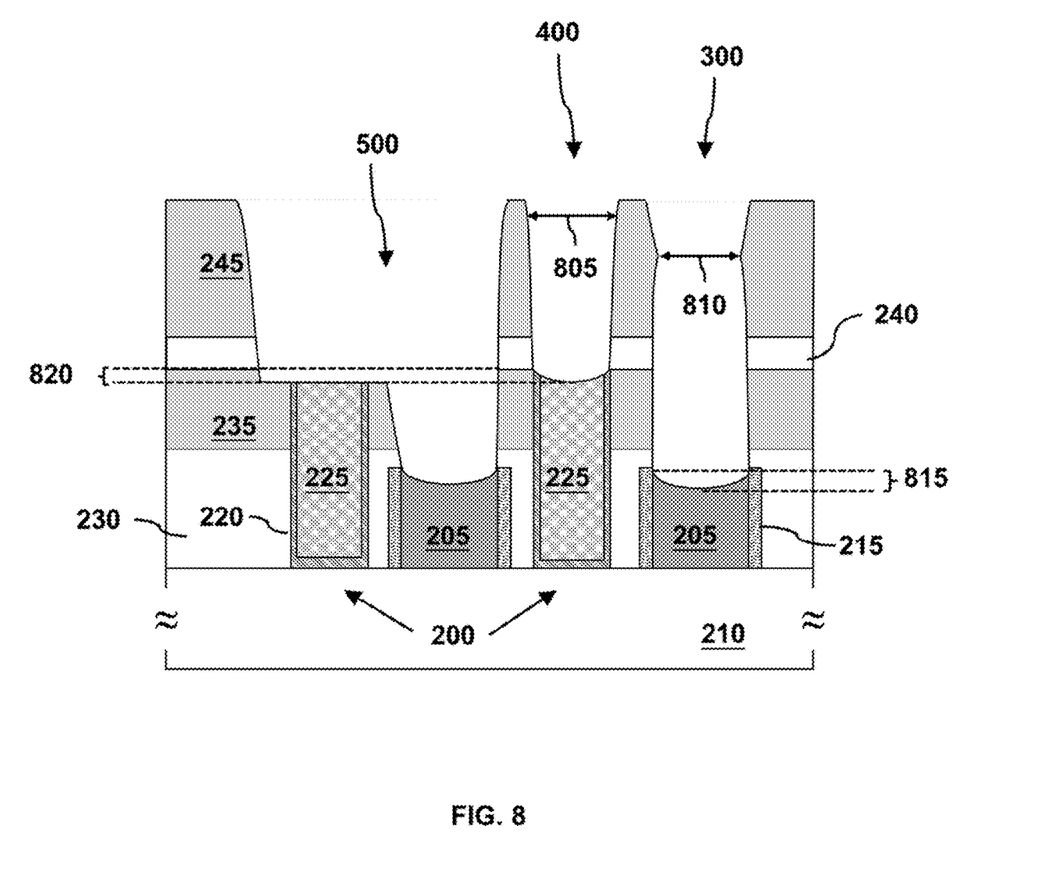
FIG. 8 is a cross-sectional view of contact openings in a dielectric stack over gate structures and metal contacts after a pre-clean process, in accordance with some embodiments.

Further, as discussed above, the pre-clean process can recess gate structures 205 and metal contacts 200. Recessed gate structures 205 and metal contacts 200 are desirable because they can reduce the resistance of the formed contacts by increasing their bottom surface area. As shown in FIG. 8, gate structures 205 can be recessed by a recess amount 815 and metal contacts 200 can be recessed by a recess amount 820. By way of example and not limitation, recess amount 815 can range from about 2 nm to about 5 nm and recess amount 820 can range from about 0.5 nm to about 3 nm. In contact opening 500, a portion of ILD 235 can also be recessed during the pre-clean process of operation 140 as shown in FIG. 8.

The aforementioned recess amounts 815 and 820 in gate structures 205 and metal contacts 200 respectively can further result in profile changes for the corresponding contact openings. For example, the bottom portion, or bottom critical dimension (CD), of the contact openings may become wider. In some embodiments, after the pre-clean process of operation 140, the bottom CD for contact openings 300 and 500 can increase by between about 5% and about 75%. Accordingly, the bottom CD for contact opening 400 can increase by between about 5% and about 75%.

Figure 9:
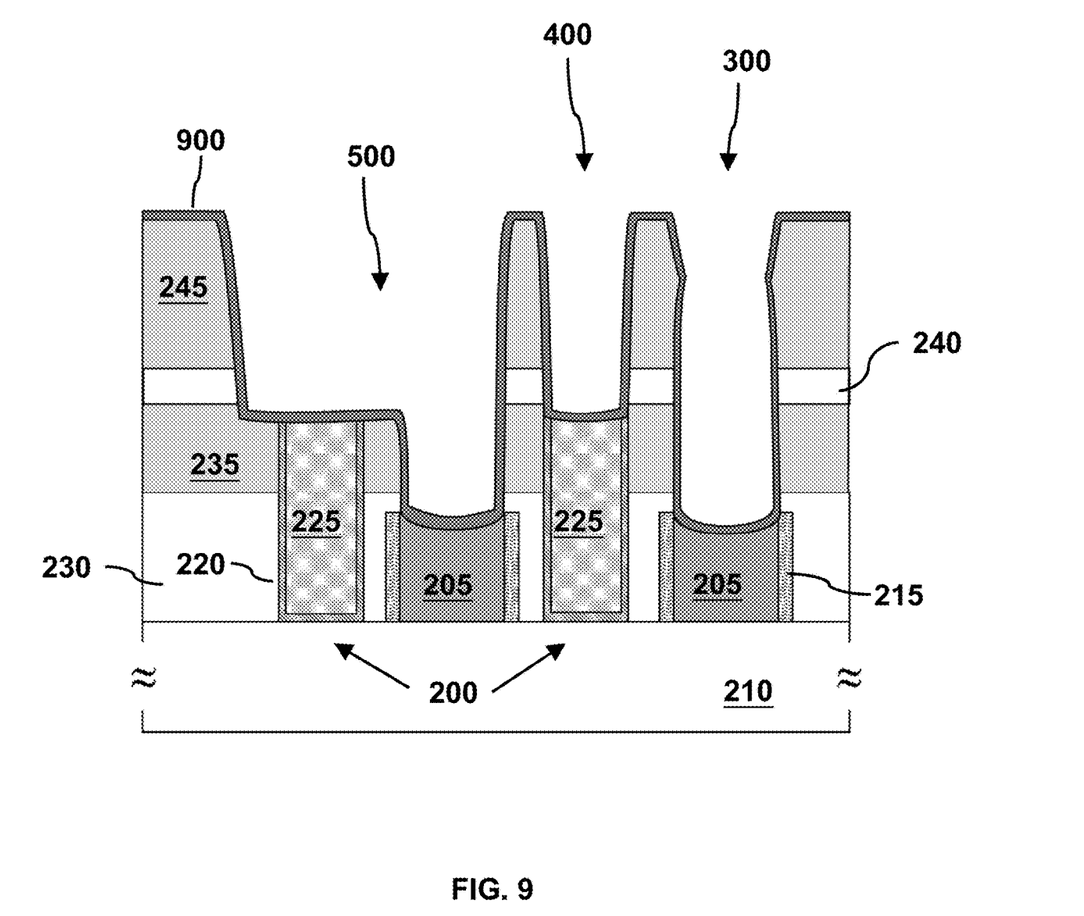
FIG. 9 is a cross-sectional view of contact openings in a dielectric stack over gate structures and metal contacts after a nucleation layer deposition, in accordance with some embodiments.

In referring to FIG. 1, method 100 continues with operation 150 where contact openings 300, 400, and 500 are filled with a metal. In some embodiments, the fill can be a two-step process that includes a conformal deposition of a nucleation layer followed by a metal fill. According to some embodiments, the nucleation layer and metal fill can include W. By way of example and not limitation, FIG. 9 is a cross-sectional view of contact openings 300, 400, and 500, after the conformal deposition of nucleation layer 900. In some embodiments, nucleation layer 900 is deposited after the pre-clean method of operation 140 without a "vacuum-break" (e.g., in-situ) to prevent, or limit, oxidation of recessed metal contacts 200 and gate structures 205. By way of example and not limitation, nucleation layer 900 can be deposited by chemical vapor deposition (CVD) or atomic layer deposition (ALD) at a thickness between about 2 nm and about 4 nm. In some embodiments, the substrate temperature during the nucleation metal layer deposition can range from about 350° C. to about 500° C. Other deposition methods can be used to form nucleation layer 900, such as plasma-enhanced CVD (PECVD) or plasma-enhanced ALD (PEALD). In some embodiments, the nucleation layer does not fill contact openings 300, 400, and 500.

Figure 10:
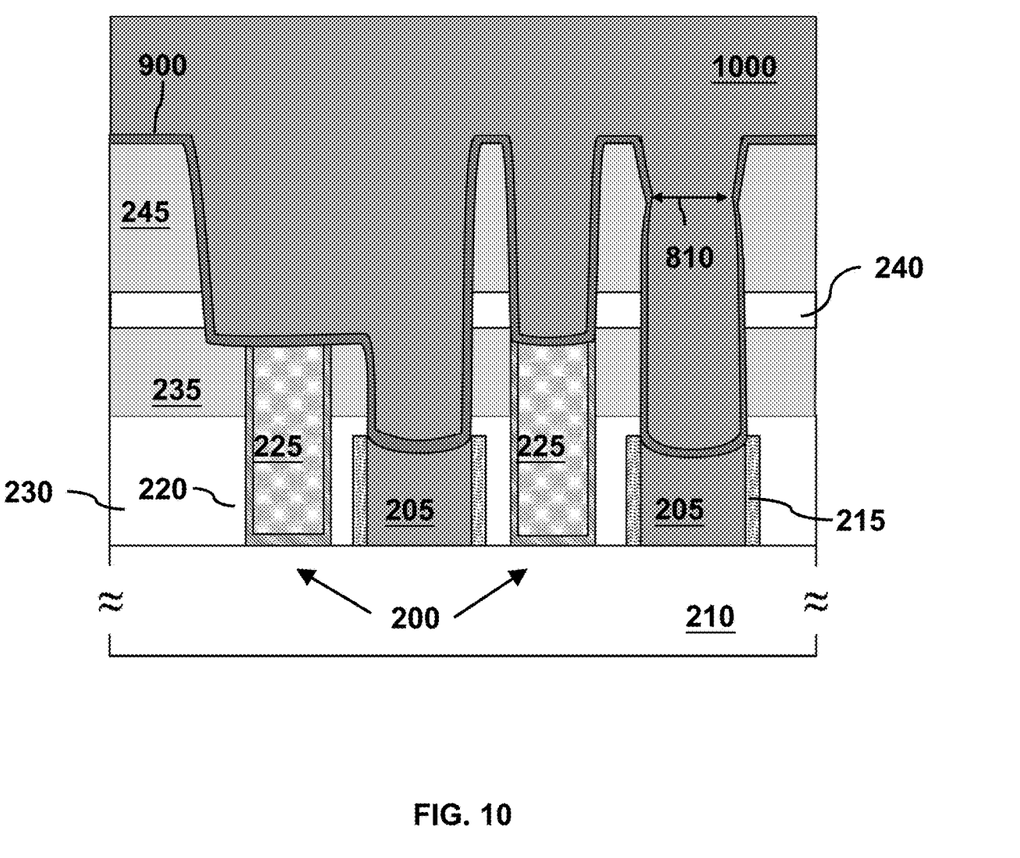
FIG. 10 is a cross-sectional view of contact openings in a dielectric stack over gate structures and metal contacts after a metal deposition, in accordance with some embodiments.

The metal fill can be deposited by CVD at a thickness between about 130 nm and about 180 nm. By way of example and not limitation, FIG. 10 shows the deposition of metal fill 1000 on nucleation layer 900. As shown in FIG. 10, metal fill 1000 fills contact openings 300, 400, and 500. By way of example and not limitation, metal fill 1000 may not be limited to W and other metals can be used. In some embodiments, metal fill 1000 is deposited with an overburden that can cover the top surface of ILD 245.

Figure 11:
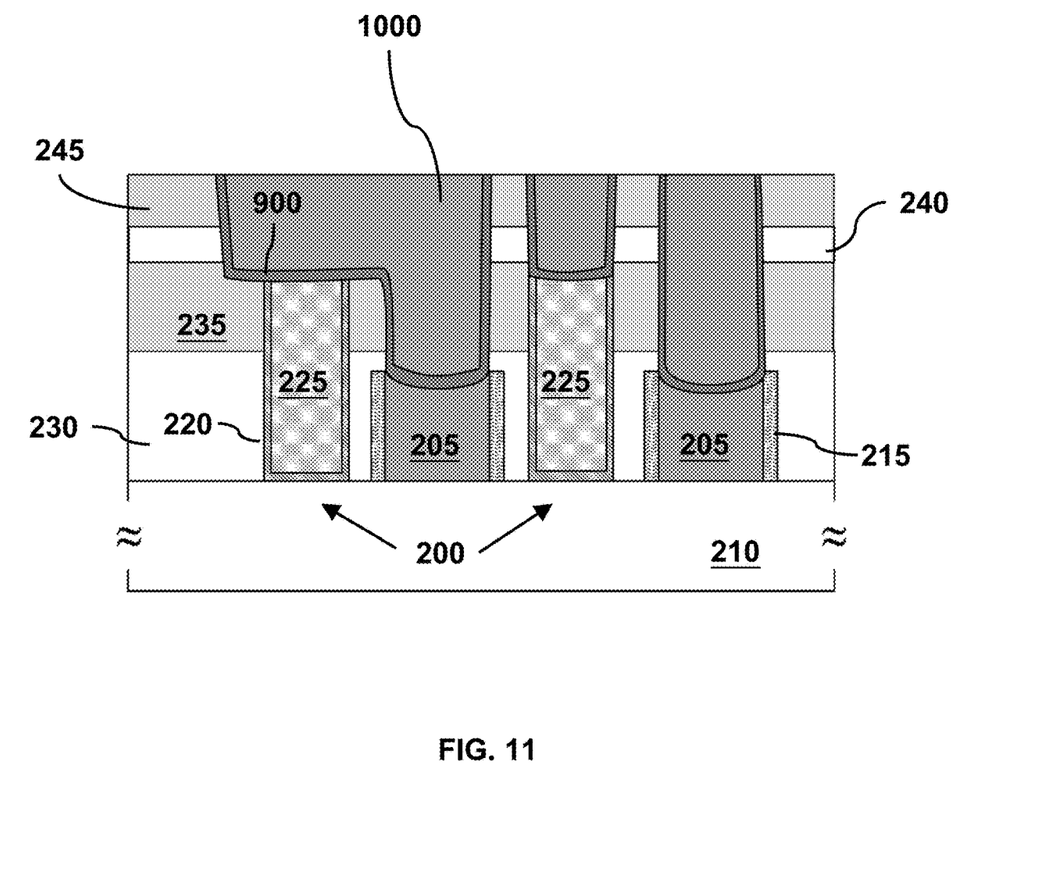
FIG. 11 is a cross-sectional view of metal contacts in a dielectric stack over gate structures and metal contacts after a chemical mechanical planarization process, in accordance with some embodiments.

In some embodiments, a chemical mechanical planarization (CMP) process can be used to polish metal fill 1000, nucleation layer 900 and portions of ILD 245 below overhang 810 as shown in FIG. 11. After the CMP process, the top surfaces of metal fill 1000 and ILD 245 are substantially co-planar. The CMP operation completes the formation of the metal contacts over metal contacts 200 and gate structure 205.

In some embodiments, the pre-clean process described in method 100 can be applied to contact openings that are formed over a variety of conductive structures including, but not limited to, gate structures, contacts, source/drain regions, etc.

A pre-clean process with improved cleaning efficiency is disclosed. According to some embodiments, the pre-clean process can mitigate contact profile changes and reduce, or prevent, oxide re-deposition from the sidewalls of a contact opening to the bottom of the contact. In some embodiments, the pre-clean process includes sputtering with argon ions having improved ion directionality. A tunable bias by a stack direct current power source unit coupled with an inductively coupled plasma power source can be used to control the direction and energy of the argon ions. Further, a set of magnets or coils located on the sidewalls of the pre-clean reactor can further enhance the directionality of the argon ions. In some embodiments, an extended pedestal with a wide diameter (e.g., 300 mm to 330 mm) and extended height (e.g., between about 12.0 mm and about 12.5 mm) can be used to improve the pre-clean uniformity across the wafer. In some embodiments, the tunable bias range provided by the direct current power stuck unit can be from about −100 Volts to about 100 Volts.

In some embodiments, a method includes: forming a dielectric layer over a contact region on a substrate; etching the dielectric layer to form a contact opening to expose the contact region; and pre-cleaning the exposed contact region to remove a residual material formed by the etching. Further, in the method, the pre-cleaning includes: exposing the first contact region to an inductively coupled radio frequency (RF) plasma; applying, with a direct current power supply unit (DC PSU), a bias voltage to the substrate; and applying a magnetic field to the inductively coupled RF plasma to collimate ions.

In some embodiments, a system includes: a conductive pedestal configured to support a substrate; a direct current power supply unit (DC PSU) electrically coupled to the substrate through the conductive pedestal and configured to apply a bias voltage to the substrate; an inductively coupled radio frequency (RF) power supply configured to generate a plasma; and a magnet configured to generate a magnetic field that collimates ions in the plasma.

In some embodiments, a method includes: forming transistors over a substrate, where each transistor comprises a gate, a source, and a drain; forming metal contacts on the source and the drain of each transistor; depositing a dielectric layer over the transistors and the metal contacts; etching a first opening in the dielectric layer to expose the gate of each transistor; etching a second opening in the dielectric layer to expose the metal contacts, where the second opening has a smaller aspect ratio that the first opening; and performing a pre-clean to remove a residual material formed on the exposed gate of each of the transistors and the metal contacts by the etching. Further, the method includes: performing the pre-clean includes forming a plasma; applying a bias voltage to the substrate through a conductive pedestal electrically that is connected to a direct current power supply unit (DC PSU); and applying a magnetic field to collimate the ions from the plasma.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer over a contact region on a substrate;
   etching the dielectric layer to form a contact opening to expose the contact region; and
   pre-cleaning the exposed contact region to remove a residual material formed by the etching, wherein the pre-cleaning comprises:
      exposing the contact region to an inductively coupled radio frequency (RF) plasma;
      applying, with a direct current power supply unit (DC PSU), a bias voltage to the substrate; and
      applying a magnetic field to the inductively coupled RF plasma to collimate ions from the inductively coupled RF plasma.

2. The method of claim 1, wherein the DC PSU is electrically coupled to the substrate through an RF generator.

3. The method of claim 1, wherein the bias voltage ranges between about −100 Volts and about 100 Volts.

4. The method of claim 1, wherein applying the bias voltage comprises applying the bias voltage to the substrate through a conductive pedestal with a diameter between about 300 mm and about 330 mm.

5. The method of claim 1, wherein applying the magnetic field comprises generating the magnetic field through magnets with opposite polarities, and wherein the magnetic field is perpendicular to a top surface of the substrate.

6. The method of claim 1, wherein applying the magnetic field comprises generating the magnetic field through electromagnets connected to an RF source, and wherein the magnetic field is perpendicular to a top surface of a conductive pedestal supporting the substrate.

7. The method of claim 1, wherein the residual material comprises silicon oxide ($SiO_2$), carbon-doped silicon oxide ($SiO_xC$), silicon oxy-nitride (SiON), silicon-oxy-carbon nitride (SiOCN), silicon carbide (SiC), silicon carbon nitride (SiCN), or a combination thereof.

8. The method of claim 1, wherein the pre-cleaning comprises recessing the contact region from about 0.5 nm to about 5 nm.

9. The method of claim 1, wherein the inductively coupled RF plasma comprises argon plasma.

10. The method of claim 1, wherein applying the bias voltage comprises increasing the bias voltage to narrow a top width of the contact opening when the contact opening has an aspect ratio higher than about 3:1.

11. The method of claim 10, wherein the top width of the contact opening ranges from about 12 nm to about 16 nm.

12. The method of claim 1, wherein applying the bias voltage comprises increasing the bias voltage to widen a top width of the contact opening when the contact opening has an aspect ratio lower than about 3:1.

13. A method, comprising:
forming transistors over a substrate, wherein each transistor comprises a gate, a source, and a drain;
forming metal contacts on the source and the drain of each transistor;
depositing a dielectric layer over the transistors and the metal contacts;
etching a first opening in the dielectric layer to expose the gate of each transistor;
etching a second opening in the dielectric layer to expose the metal contacts, wherein the second opening has a smaller aspect ratio than the first opening; and
performing a pre-clean to remove a residual material formed on the exposed gate of each of the transistors and the metal contacts by the etching, wherein performing the pre-clean comprises:
forming a plasma;
applying a bias voltage to the substrate through a pedestal electrically connected to a direct current power supply unit (DC PSU); and
applying a magnetic field to collimate ions from the plasma.

14. The method of claim 13, wherein the bias voltage ranges between about −100 Volts and about 100 Volts.

15. The method of claim 13, wherein the plasma comprises argon plasma and the DC PSU is electrically connected to the pedestal through a radio frequency generator.

16. A method, comprising:
forming first and second gate structures;
forming first and second contact structures on a substrate, wherein the first contact structure is adjacent to the first gate structure;
depositing a dielectric stack on the first and second gate structures and on the first and second contact structures;
etching a first opening in the dielectric stack to expose the first gate structure and the first contact structure;
etching a second opening in the dielectric stack to expose the second gate structure;
etching a third opening in the dielectric stack to expose the second contact structure; and
performing a pre-clean to remove residual material formed during the etching of the first, second, and third openings on the first and second gate structures and on the first and second contact structures, wherein performing the pre-clean comprises:
forming, above the dielectric stack, a plasma comprising argon ions;
applying a bias voltage to the substrate via a conductive pedestal electrically coupled to a direct current power supply unit (DC PSU) to accelerate the argon ions towards the substrate; and
while applying the bias voltage, applying a magnetic field to the plasma having a direction perpendicular to a top surface of the substrate to collimate the argon ions impinging the substrate.

17. The method of claim 16, wherein performing the pre-clean further comprises increasing the applied bias voltage to widen a top portion of the third opening and to form a reentrant profile for the second opening.

18. The method of claim 16, wherein performing the pre-clean further comprises widening a bottom portion of the first, second, and third openings.

19. The method of claim 16, wherein applying the bias voltage comprises applying the bias voltage at a voltage value between about −100 Volts and 100 Volts.

20. The method of claim 16, wherein forming the first and second gate structures and the first and second contact structures comprise forming the first and second contact structures taller than the first and second gate structures so that the second and third openings have different aspect ratios.

* * * * *